United States Patent [19]

Bitzer et al.

[11] Patent Number: 5,077,743
[45] Date of Patent: Dec. 31, 1991

[54] SYSTEM AND METHOD FOR DECODING OF CONVOLUTIONALLY ENCODED DATA

[75] Inventors: Donald L. Bitzer, Urbana; Christopher E. Alix, Champaign; Kevin M. Leuthold, Urbana, all of Ill.

[73] Assignee: Board of Trustees of the University of Illinois, Urbana, Ill.

[21] Appl. No.: 410,071

[22] Filed: Sep. 20, 1989

[51] Int. Cl.⁵ .................... G06F 11/10; H03M 13/12
[52] U.S. Cl. .......................................... 371/43; 371/45
[58] Field of Search ............................... 371/43, 44, 45

[56] References Cited

U.S. PATENT DOCUMENTS

| | | | |
|---|---|---|---|
| 3,728,678 | 4/1973 | Tong | 371/44 |
| 4,293,951 | 10/1981 | Rhodes | 371/43 |
| 4,355,392 | 10/1982 | Doi et al. | 371/45 |
| 4,691,318 | 9/1987 | Entenman | 371/43 |
| 4,888,779 | 12/1989 | Karabed et al. | 371/43 |

OTHER PUBLICATIONS

Kanefsky, Morton, "Communication Techniques for Digital and Analog Signals", Harper and Row, 1985, pp. 330-339.
Das, J., "Review of Digital Communications", Wyley, 1988, pp. 414-429.
John S. Snyder, "High-Speed Viterbi Decoding of High-Rate Codes", 6th Annual Conf. on Digital Satellite Communications, Phoenix, 1983, vol. XII, pp. 16-23, IEEE 1983.
Yasuda et al., "Development of Variable-Rate Viterbi Decoder and its Performance Characteristics", 6th International Conf. on Digital Statellite Communications, Phoenix, 1983, IEEE, 1983, vol. XII, pp. 24-31.
Andrew J. Viterbi, "Convolution Codes and Their Performance in Communication Systems", IEEE Transaction on Communications Technology, vol. COM-19, No. 5, Oct. 1971, pp. 751-772.
Batson et al., "Simulation Results for the Viterbi Decoding Algorithm", NASA Technical Report, Nov. 1972, NASA TR-R-396, pp. 1-52.

Primary Examiner—Charles E. Atkinson
Attorney, Agent, or Firm—Perman & Green

[57] ABSTRACT

A convolutionally encoded bit stream is generated and employs a greater number of transmitted parity bits than input data bits. The encoded bit stream is decoded through the use of Exclusive OR operations upon a succession of lengths of received party bits. Non-zero Exclusive OR results determine probable parity bit corrections. Those corrections are used to alter the received, encoded parity bit stream. The altered bit stream is then converted into a data bit stream in accordance with subsequent Exclusive OR operations and a decoding table.

14 Claims, 5 Drawing Sheets

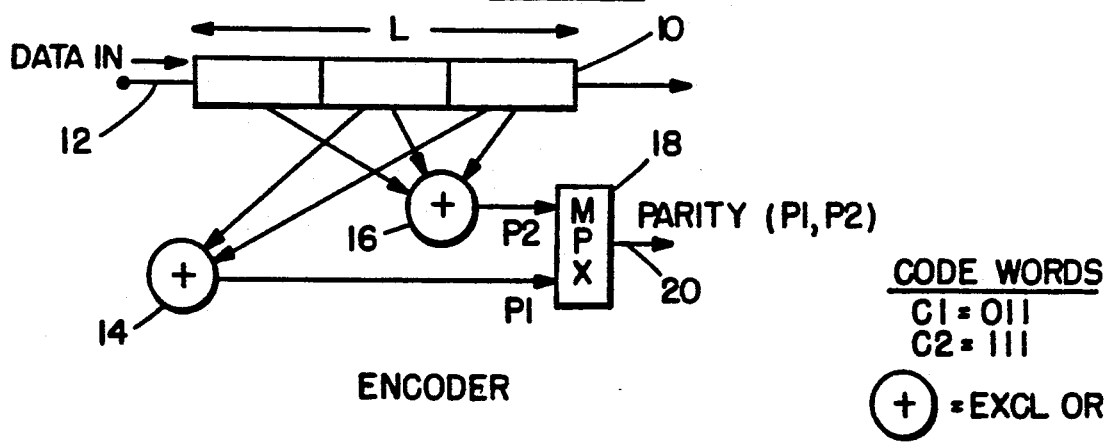
FIG. 1.
ENCODER
CODE WORDS
C1 = 011
C2 = 111
⊕ = EXCL OR
L = 3
FIG. 2.
| ORIG STATE | NEW DATA BIT | NEW STATE | OUTPUT PARITY CODE |
|---|---|---|---|
| 00 | 0 | 00 | 00 |
| 00 | 1 | 01 | 11 |
| 01 | 0 | 10 | 11 |
| 01 | 1 | 11 | 00 |
| 10 | 0 | 00 | 01 |
| 10 | 1 | 01 | 10 |
| 11 | 0 | 10 | 10 |
| 11 | 1 | 11 | 01 |
C1 = 011
C2 = 111
L = 3
FIG. 3.
INPUT DATA = 1011011
RESULTING PARITY = 1000101000
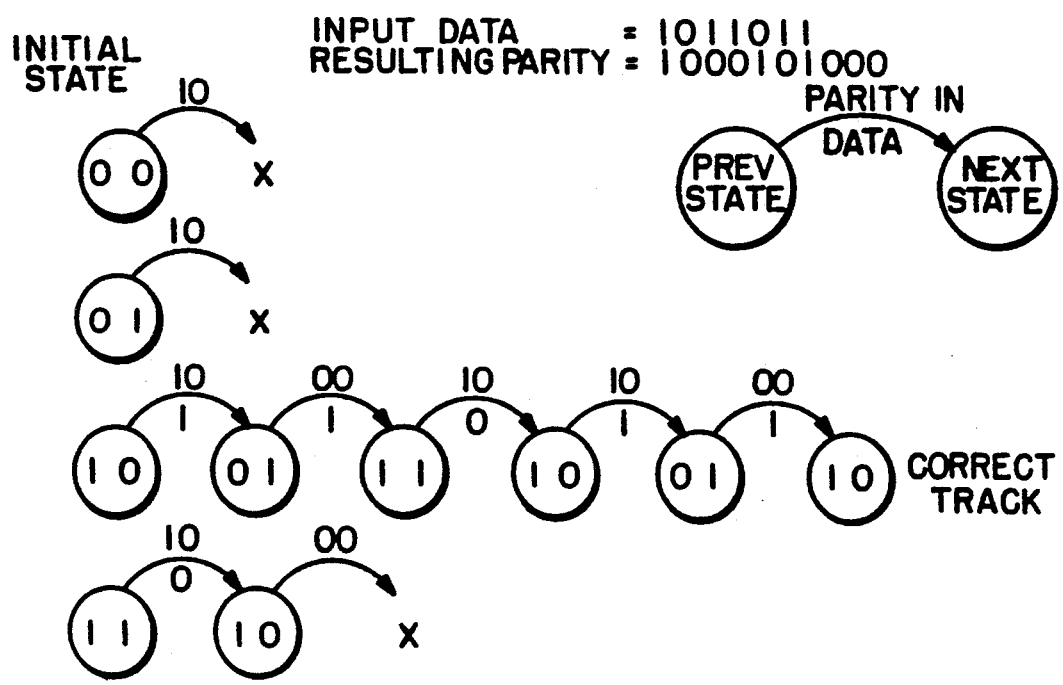

FIG. 4.

FULL ENCODING TABLE

| | PARITY | DATA |
|---|---|---|
| 0 | 0 0 0 0 | ↔ 0 0 0 0 |
| 1 | 0 0 1 1 | ↔ 0 0 0 1 |
| 2 | 1 1 1 1 | ↔ 0 0 1 0 |
| 3 | 1 1 0 0 | ↔ 0 0 1 1 |
| 4 | 1 1 0 1 | ↔ 0 1 0 0 |
| 5 | 1 1 1 0 | ↔ 0 1 0 1 |
| 6 | 0 0 1 0 | ↔ 0 1 1 0 |
| 7 | 0 0 0 1 | ↔ 0 1 1 1 |
| 8 | 0 1 0 0 | ↔ 1 0 0 0 |
| 9 | 0 1 1 1 | ↔ 1 0 0 1 |
| 10 | 1 0 1 1 | ↔ 1 0 1 0 |
| 11 | 1 0 0 0 | ↔ 1 0 1 1 |
| 12 | 1 0 0 1 | ↔ 1 1 0 0 |
| 13 | 1 0 1 0 | ↔ 1 1 0 1 |
| 14 | 0 1 1 0 | ↔ 1 1 1 0 |
| 15 | 0 1 0 1 | ↔ 1 1 1 1 |

UNIQUE RELATIONSHIP
$D = 2(L-1)$
$L = $ CODE WD LENGTH $= 3$
$D = $ DATA WD LENGTH $= 4$

FIG. 5.

REDUCED ENCODING TABLE

| | PARITY | DATA |
|---|---|---|
| 1 | 0 0 1 1 | ↔ 0 0 0 1 |
| 2 | 1 1 1 1 | ↔ 0 0 1 0 |
| 4 | 1 1 0 1 | ↔ 0 1 0 0 |
| 8 | 0 1 0 0 | ↔ 1 0 0 0 |

FIG. 6.

REDUCED DECODING TABLE

| PARITY | DATA |
|---|---|
| 1 0 0 0 | ↔ 1 0 1 1 |
| 0 1 0 0 | ↔ 1 0 0 0 |
| 0 0 1 0 | ↔ 0 1 1 0 |
| 0 0 0 1 | ↔ 0 1 1 1 |

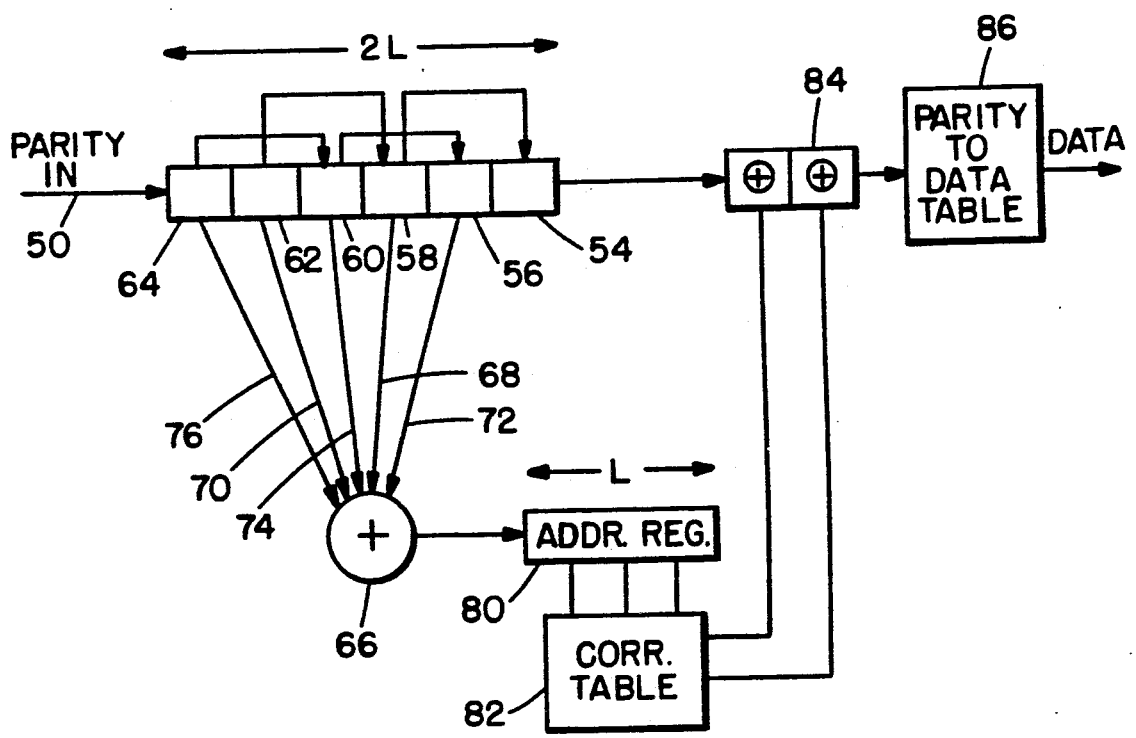

SYSTEM AND METHOD FOR DECODING OF CONVOLUTIONALLY ENCODED DATA

FIELD OF THE INVENTION

This invention relates to digital decoding methods and systems and, more particularly, to methods and systems for decoding and error correcting convolutionally encoded digital data.

BACKGROUND OF THE INVENTION

Error correction decoding techniques are increasingly being applied to digital communication links to enable significant performance improvements. Those techniques enable, for fixed transmit (or receive) power levels and for allowable bit error probabilities, the transfer of more information per unit time. Several widely employed encoding techniques are categorized as block and convolutional. Block codes (sometimes referred to as algebraic codes) involve the assignment of certain structured blocks of bits to each possible group of information bits. They are highly structured and decoding algorithms generally either exploit code properties that result from the structure or apply probablistic information obtained from the received signal.

Convolutional codes are generally conceded to be operationally better than block codes. To convolutionally encode a digital data stream, a code word of length L (called the constraint length) is employed as a mask. The one bits of the data stream that appear through the mask are Exclusive OR'd to obtain a parity bit from the L length of data bits. The bit stream is then moved by one bit position with respect to the mask, and the process is repeated. This results in the generation of another parity bit which includes information from the new L data bits.

If two different code words are used as masks, then two bits of parity information result for every data bit. The ratio of the number of original data bits to the number of replacement parity bits is called the coding rate. Thus, where one data bit is replaced by two parity bits, the coding rate is one half.

Referring to FIG. 1, a circuit for producing a one-half rate convolutional code is shown and includes shift register 10 which is L positions long, where L equals the length of the code word. Shift register 10 is a serial shift register which receives, in a clocked manner, an input binary digital data stream via input line 12. For this description, it will be assumed that two, 3 bit code words are employed as masks to achieve the convolutional encoding of the data stream. It is to be understood, that three bit code words are merely used for ease of explanation and that, preferably, much longer length code words would be used, as they enable substantially increased error correction capabilities. Furthermore, while only a pair of code words is shown, additional code words may be employed to provide a higher redundancy rate of parity bit transmission.

Code word C1 = 011 and code word C2 = 111. Those code words are used as "masks", with each one bit therein indicating that the value present in the corresponding bit position in shift register 10 is fed to an Exclusive OR circuit. Thus, Exclusive OR circuit 14 has applied thereto only data bits appearing in the second and third stages of shift register 10 (per code word C1). Exclusive OR circuit 16 receives inputs from all three stages of shift register 10 and implements code word C2 = 111. As is well known, Exclusive OR circuits 14 and 16 will only provide "high" outputs when their inputs reflect an odd number of one bits on their input lines. Thus, for each three data bits in shift register 10, Exclusive OR circuit 14 provides an output P1 to multiplexer 18 which is indicative of the data states of the second and third stages of shift register 10. Exclusive OR 16, on the other hand, for each set of bits in shift register 10, provides an output P2 to multiplexer 18 which is indicative of the data states in all three stages. Multiplexer 18 then commutates P1 and P2 onto output line 20 for transmission. As each succeeding bit is fed into shift register 10 and a bit exits therefrom, two new values of P1 and P2 are generated and emplaced on output line 20.

Thus, as each new bit is shifted into the L bit long shift register, there results a pair of parity bits. The existing contents of the register (except for the oldest bit), determines which of four possible values will result from the shifting in of either a Zero or One data bit. Thus, each new data bit affects the current parity pair output and the next L-1 pairs as well.

A decoding technique for analyzing convolutional codes was proposed by A.J. Viterbi. The Viterbi technique is described in "Convolutional Codes and Their Performance in Communications Systems", A.J. Viterbi, IEEE Transactions on Communications Technology, Volume Com-19, No. 5, October 1971, pages 751-772. The Viterbi decoding process requires the continuous tracking of received parity bits through all possible changes in state.

Viterbi's technique can be understood by referring to FIG. 2 which shows the relationships between original data states, new data states, and the possible parity codes P1, P2 which can be generated therefrom. For example, assume an original data state in the encoding shift register of 01. The next bit entering the encoding shift register must be either a 1 or a 0. If the bit is a 1, the resulting data state in the shift register is 11. This results in a P1, P2 parity output of 00. On the other hand, if a 0 enters the encoding shift register, the resulting data state is 10 and the P1, P2 parity state is 11.

However, if the aforementioned state change results in an incorrect parity pair being generated (e.g. 01 or 10), it is known that one or more parity bits are in error.

FIG. 2 thus shows the various possible parity code pairs which can result when an original data state traverses to a new data state by the receipt of a new 0 or 1 bit. In a Viterbi decoding system, an original data state is determined from the analysis of an initial pair of P1, P2 parity bits, and a subsequent data state is determined by the analysis of the next set of P1, P2 parity bits. If the subsequent pair gives rise to an impossible new data state, one or both of the parity bits must be in error. Thus, assuming the initial data state was 10, and the decoding circuitry finds that the subsequent parity code is 11, then it is known that a parity bit is in error since, as FIG. 2 shows, no transition from state 10 can result in a 11 parity pair.

The Viterbi decoding scheme requires that a record be kept of each change of a parity bit to correct an incorrect parity and create an allowed data state transition. This requires that $2^{(L-1)}$ states must be continuously tracked. With an L length of 3, this is not a serious problem; however, as L approaches 5,6 or 7, the computing power required to accomplish the continuous tracking increases exponentially.

The Viterbi decoding technique finishes its decoding by selecting the state track with the smallest number of required parity bit changes and designates as acceptable, the data bits associated with that track. This is schematically indicated in FIG. 3 wherein each of the two bit data states are continuously tracked and their subsequent P1, P2 parity bits are also tracked (with X indicating that a subsequent P1, P2 parity pair cannot follow the preceding data state). It is to be noted that the data state track for 10 turns out to be the longest track and is the one selected by the Viterbi decoding system.

It is an object of the present invention to provide a convolutional decoding method and apparatus which is simple in its execution and economic in its implementation.

It is a further object of this invention to provide a convolutional decoding method and system which enables the use of code words longer than heretofore possible.

It is another object of this invention to provide a convolutional decoding system and method which is rapid in its execution and requires no state tracking.

It is a still further object of this invention to provide a convolutional decoding system and method wherein error detection is independent of the data.

It is still another object of this invention to provide a convolutional decoding system and method wherein error correction is readily performed.

SUMMARY OF THE INVENTION

A convolutionally encoded bit stream is generated and employs a greater number of transmitted parity bits than input data bits. The encoded bit stream is decoded through the use of Exclusive OR operations upon a succession of lengths of received parity bits. Non-zero Exclusive OR results determine probable parity bit corrections. Those corrections are used to alter the received, encoded parity bit stream. The altered bit stream is then converted into a data bit stream in accordance with subsequent Exclusive OR operations and a decoding table.

DESCRIPTION OF THE DRAWINGS

FIG. 1 is a block diagram of a convolutional encoder in accordance with the prior art.

FIG. 2 is a state diagram for a constraint length $L=3$, which illustrates possible new data states which can occur from either a 1 or 0 bit being added to an original data state, and the possible parity codes which can derive therefrom.

FIG. 3 is a diagram helpful in understanding the operation of a prior art Viterbi convolutional decoding process.

FIG. 4 is a table which illustrates parity and data relationships wherein, for each parity code, there is a unique data code.

FIG. 5 illustrates a reduced encoding table which, in combination with Exclusive OR operations, performs the functions of the table of FIG. 4.

FIG. 6 illustrates a reduced decoding table which enables conversion of parity bits to uniquely related data bits through the use of Exclusive OR operations.

FIG. 10 illustrates the application of the decoded findings from FIGS. 8 and 9 to achieve an output indicative of erroneous parity bits in either the P1 or P2 position.

FIG. 11 is a block diagram of a decoder circuit in accordance with the invention.

DETAILED DESCRIPTION OF THE INVENTION

Figure 7:
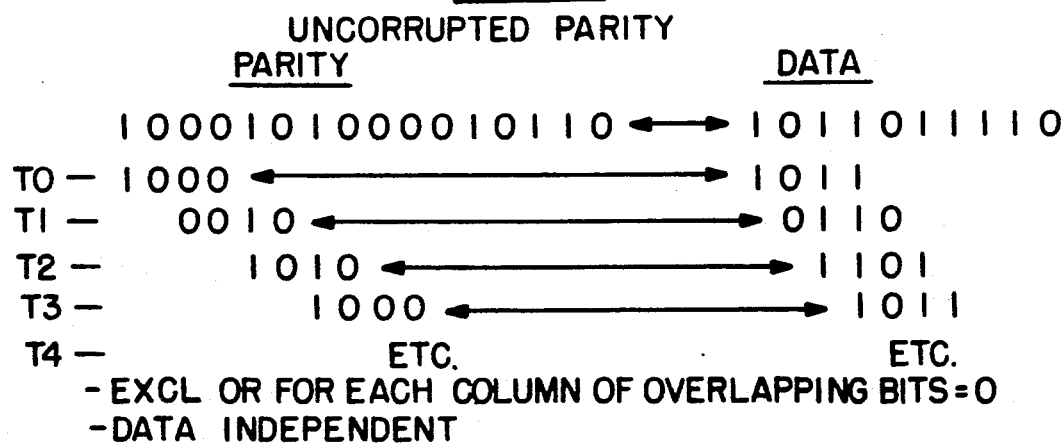
FIG. 7 ,illustrates the decoding technique of this invention as applied to a series of received, uncorrupted parity bits.

As will be understood, Exclusive-OR or modulo 2 sum logical operations are vital to the functioning of the decoding method and system of this invention. Furthermore, it is vital in parity encoding a data stream, that the encoded sequence of parity bits uniquely represents a sequence of data bits. It has been determined that for a constraint length L, code words can be chosen such that a data word of length D will have a unique relationship to a series of parity bits where the following equation is satisfied:

$$D=2(L-1)$$

Thus, where the length L of a code word is three bits, a convolutional encoding technique can generate two pair of parity bits uniquely related to a four bit data word. Such an encoding relationship is shown in the table of FIG. 4, where the code word length $L=3$. As shown therein, for each of the sixteen values of data (i.e., 0000–1111), a unique parity relationship exists. It can thus be understood by those skilled in the art, that identical mathematical operations may be carried out with respect to corresponding parity and data bit groups, while still maintaining the unique relationship evidenced by the table.

An example will aid in understanding how a unique set of parity bits are generated from each unique set of data bits. Taking the data bits equal to 7, (0111), the encoding thereof occurs as shown in FIG. 1. Assuming the use of code words C1 and C2, parity bit P1 is generated by AND'ing the first three data bits (011) with code word C1 (011) and then Exclusive OR'ing the resulting output for a result $=0$. P2 is similarly generated by AND'ing code word C2 (111) with the first three data bits (011) and Exclusive OR'ing the resultant output to also give a 0. To generate the second pair of parity bits P1, P2, the data bits are incremented so that 111 is now resident in the three stages of shift register 10. Identical AND'ing and Exclusive Or'ing operations result in $P1=0$ and $P2=1$. All corresponding parity values are derived in exactly the same manner with respect to each of the respective series of data bits.

Since there is a unique parity value for each data value, the sixteen position table of FIG. 4 can be reduced to four positions by realizing that the aforementioned set of unique relationships enables four data bit groups to be manipulated to achieve all sixteen values of parity. The reduced table is shown in FIG. 5 and employs the 1, 2, 4, and 8 data representations, each of which has a one bit in a different bit position. If it is desired to obtain the corresponding parity for any other group of data bits, data bit groups with ones in the proper positions merely need to be Exclusive OR'd together, along with their corresponding parity values. For instance, to achieve the parity value for a series of data bits equal to 6 (0110), it is merely necessary to Exclusive OR together the data bits for 2 and 4 (0010, 0100) and their associated parities (1111, 1101). This procedure enables a table to be constructed of the size $2(L-1)$ rather than $2^{(L-1)}$. When using data words of length 4 and code words of length 3, the difference of table size is not significant, however, as greater length code words are employed (e.g. 15-20 bits), the sizes of the resulting encoding tables are greatly reduced.

The same technique can be employed to decode a received parity bit stream. While the generation of a parity group for a given data group is straight-forward, the reverse conversion is not as direct. A more complex derivation is required to obtain a unique data bit group corresponding to each case where there is only a single one in a set of parity bits (to enable Exclusive-OR operations to be applied to both sides of the relationship).

To reconstruct an original data stream from a received and corrected parity stream, it is necessary to generate a table performing the inverse transformation of the table of FIG. 5. An algorithm for inverting the data matrix of FIG. 5, to generate the required transformation table, is as follows:

1. Consider the data and parity halves of the reduced encoding table as $2(L-1)$ by $2(L-1)$ binary matrices (matrices with element values restricted to 0 and 1). Define a "line" of this table as consisting of a row from the data matrix and its corresponding row from the parity matrix.
2. Triangularize the parity matrix by repeatedly applying the following two transformations as appropriate, until the parity matrix contains only zero entries to the left of the main diagonal:
   a. Exchanging a line of the table with another line.
   b. Replacing a line K of the table with the bitwise Exclusive-OR of line K and another line.
3. Perform back substitution by repeatedly applying the aforementioned transformations as appropriate, until the parity matrix is an identity matrix (with ones along the main diagonal and zeroes in all other entries).

These steps are equivalent to a mathematical process for inverting a matrix, except that Exclusive-OR operations, instead of arithmetic operations, are applied to eliminate non-zero entries.

Indicated below at (a) is a reproduction of the reduced encoding table of FIG. 5.

| (a) | parity | ⟷ | data | |
|---|---|---|---|---|
| | 0011 | ⟷ | 0001 | (A) |
| | 1111 | ⟷ | 0010 | (B) |
| | 1101 | ⟷ | 0100 | (C) |
| | 0100 | ⟷ | 1000 | (D) |

By exchanging several lines, the parity side of the table can be reordered such that no 1 bit appears below and to the left of the leftmost 1 in any row, resulting in (b):

| (b) | parity | ⟷ | data | |
|---|---|---|---|---|
| | 1111 | ⟷ | 0010 | (A) |
| | 1101 | ⟷ | 0100 | (B) |
| | 0100 | ⟷ | 1000 | (C) |
| | 0011 | ⟷ | 0001 | (D) |

Replacing (B) with (B) XOR (A) results in (c):

| (c) | parity | ⟷ | data | |
|---|---|---|---|---|
| | 1111 | ⟷ | 0010 | (A) |
| | 0010 | ⟷ | 0110 | (B) |
| | 0100 | ⟷ | 1000 | (C) |
| | 0011 | ⟷ | 0001 | (D) |

Exchanging (B) and (C) results in (d):

| (d) | parity | ⟷ | data | |
|---|---|---|---|---|
| | 1111 | ⟷ | 0010 | (A) |
| | 0100 | ⟷ | 1000 | (B) |
| | 0010 | ⟷ | 0110 | (C) |
| | 0011 | ⟷ | 0001 | (D) |

Replacing (D) with (D) XOR (C), table (e) is generated:

| (e) | parity | ⟷ | data | |
|---|---|---|---|---|
| | 1111 | ⟷ | 0010 | (A) |
| | 0100 | ⟷ | 1000 | (B) |
| | 0010 | ⟷ | 0110 | (C) |
| | 0001 | ⟷ | 0111 | (D) |

The parity matrix mow has no zeroes to the left of the main diagonal. The only back substitutions required in this case involve row (A); Replacing (A) with (A) XOR (B) results in table (f):

| (f) | parity | ⟷ | data | |
|---|---|---|---|---|
| | 1011 | ⟷ | 1010 | (A) |
| | 0100 | ⟷ | 1000 | (B) |
| | 0010 | ⟷ | 0110 | (C) |
| | 0001 | ⟷ | 0111 | (D) |

Replacing (A) with (A) XOR (C) results in table (g):

| (g) | parity | ⟷ | data | |
|---|---|---|---|---|
| | 1001 | ⟷ | 1100 | (A) |
| | 0100 | ⟷ | 1000 | (B) |
| | 0010 | ⟷ | 0110 | (C) |
| | 0001 | ⟷ | 0111 | (D) |

Finally, replacing (A) with (A) XOR (D) results in table (h) which is also shown in FIG. 6, wherein the parity matrix has been inverted.

| (h) | parity | ⟷ | data | |
|---|---|---|---|---|
| | 1000 | ⟷ | 1011 | (A) |
| | 0100 | ⟷ | 1000 | (B) |
| | 0010 | ⟷ | 0110 | (C) |
| | 0001 | ⟷ | 0111 | (D) |

A $2(L-1)$ bit data word which encodes as a $2(L-1)$ bit parity word can now be determined by Exclusive Or'-ing the data entries from table (h) corresponding to the positions in which 1 bits appear. For example, given the table of FIG. 6, the data sequence generating a parity sequence of 1011 is determined by Exclusive OR'ing data rows (A), (C), and (D), resulting in 1010.

This chart shown in FIG. 6 enables a long code to be utilized since all unique parity combinations can be generated from a relatively minor set of parity relationships, through the Exclusive OR operator.

It can now be understood that, given a run of uncorrupted parity bits, the table of FIG. 6 and Exclusive OR operations enable data bit sequences corresponding to specific parity bit sequences to be obtained. Note that it is not necessary to correct all the parity bits in order to completely recover the original data stream. $4(L-1)$ parity bits are received for every $2(L-1)$ data bits; however, a sequence of only $2(L-1)$ parity bits is sufficient to recover $2(L-1)$ data bits. Thus, it is possible to recover the original data even in the presence of uncorrected errors in the parity stream, so long as the parity stream consists of sequences of $2(L-1)$ correct parity bits, separated by no more than $2(L-1)$ possibly incorrect parity bits.

In FIG. 7, an example is shown of how a sequence of uncorrupted parity bits can be decoded, independent of the data. A run of data bits, shown on the top line of FIG. 7, is converted to a run of parity bits P1 P2, utilizing the encoding circuit of FIG. 1. It will be noted, that all parity bits in FIG. 7 are uncorrupted. It will also be recalled that two parity bits are generated for each data bit, so that as each data bit moves out of encoding shift register 10, two parity bits are transmitted. Thus, at the receiving end of the communication link, each time two parity bits are received, a single data bit has been cycled through the encoding shift register 10. At time T0, two parity pairs, 10 00 are in the register. At time T1, an additional parity pair, 10 is received and shifted into the register etc. On the right side of FIG. 7, each parity pair has been converted to its corresponding data bit sequence, using the chart of FIG. 6.

By examining the aligned vertical columns of data bits, an important relationship can be discerned. In specific, when uncorrupted parity bit pairs are received, the columns of overlapping, derived data expressions are identical. Thus, as each column of data bits is examined, it is noted that completely identical bits are resident therein. This relationship exists no matter what the data is and is thus totally independent of the data. Thus, if each column of data bits is Exclusive OR'd together, the result will always be zero. Only when there is a parity error, will the zero Exclusive OR relationship not hold true.

Figure 8:
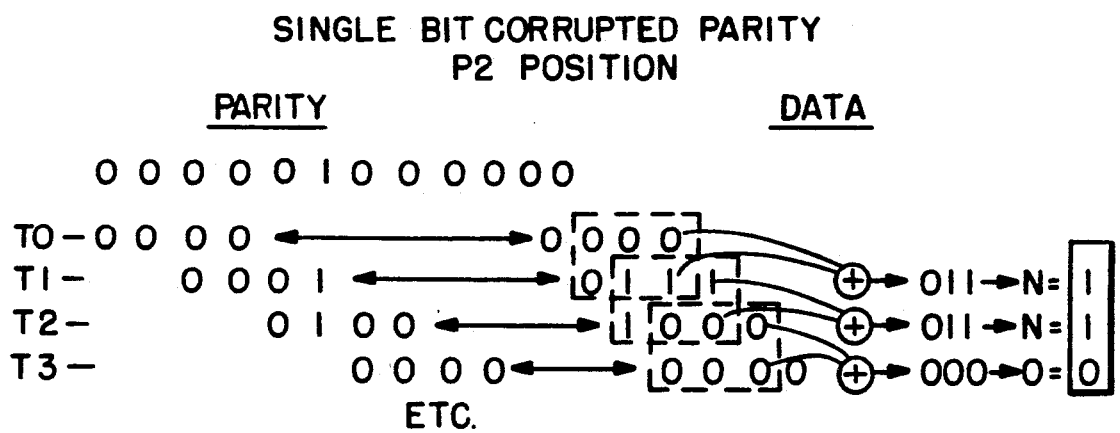
FIG. 8 illustrates the decoding technique of this invention when applied to a received parity stream with a corrupted parity bit in the P2 position.

To illustrate, reference is made to FIG. 8 which shows a single bit of corrupted parity in the P2 position (see upper left of FIG. 8). The P2 parity bit is shown as having been flipped from a zero to a one. The received parity bit groups are as shown at T0, T1, T2 and T3 and the resulting data bit groups (derived by the use of the table of FIG. 6) are shown to the right.

Note that the Exclusive-OR relationship between overlapping bits in each column of succeeding data bit groups is either zero or a fixed number (N), which number N is dependent only on the code words used to encode the data stream. As the parity bit stream slides by, two bits at a time, the Exclusive OR differences between successive columnar sets of overlapping data bits produce unique patterns of zeros or N's for any single corrupted parity bit. Also, for any combination of corrupted parity bits, the Exclusive OR operation yields a unique pattern of zeros or N's, which pattern is the reverse of the code word used to generate the accompanying parity bit position, adjacent that where the error occurred.

To further illustrate, as each pair of parity bits is received, it is converted to a corresponding data bit. At T0, parity bits 00 00 are received in the shift register and are converted to 0000 data bits. At T1, parity bits 00 01, are converted to the 0111 data bit group. The 0111 data bit group is incremented one position, so that only the left most three bits (011) overlap the previously received zero's bit data group. The overlapping T0 and T1 data bits are then Exclusive OR'd with the result being 011. The binary number N so derived is dependent upon the codes used to initially encode the data. The number N may be arbitrarily represented by a selected one bit from the sequence of bits resulting from the Exclusive-OR operation. For the purpose of the example of FIG. 8, the second bit ("1") is chosen as N and appears at T1, that bit indicating the presence of an erroneous parity (see right-most column of FIG. 8).

At T2, the parity bits 01 00 are received and converted to data bit group 1000. Here again, the overlapping bits between the T1 and T2 data representations are exclusively OR'd and again number N results. At T3, the receipt of all zero's causes the Exclusive OR result to revert to the zero state, which zero state is represented as a 0. Thus, for a single parity bit error in the P2 position, successive Exclusive OR'S of the overlapping data bit groups result in the generation of a 110 bit error group, in time sequence. It is to be noted that the output 110 is exactly the opposite of the C1 code used to encode the P1 parity bits.

Figure 9:
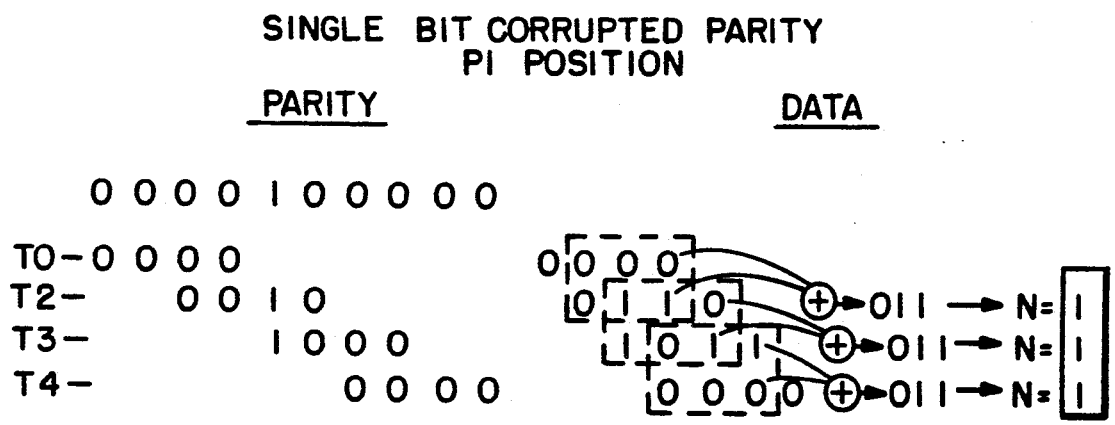
FIG. 9 illustrates the decoding technique of this invention as applied to a received parity bit stream with a corrupted parity bit in the P1 position.

Referring now to FIG. 9, a single corrupted parity bit in the P1 position is indicated and the derivation of the corresponding data bits and Exclusive-ORing of succeeding overlapping bit portions is identical to that shown for FIG. 8. In this case, however, the bit error group output is all "1's" and, while not obvious, it is the reverse of the code word C2 which was used to generate the P2 parity bits.

If both the P1 and P2 position parity bits are incorrect, it can be shown that the output bit error groups are a sequence of bits equal to 001, or the Exclusive OR of the P1 and P2 error bit groups.

From an examination of FIGS. 8 and 9, it can now be seen that if a corrupted parity bit appears in the P1 position, an Exclusive-OR analysis of the resulting data bits produces a 111 bit error group, with the first 1 bit being generated in the same time frame which includes the erroneous P1 parity bit. Likewise, if a corrupted parity bit occurs in the P2 position, there results a 110 bit error group with the first 1 appearing in the same time frame in which the corrupted P2 parity bit appears.

Referring now to FIG. 10, the relationships between received, corrupted parity bits and resulting bit error groups is charted, with time slots T0–T6 being plotted across the top of the chart. It will be recalled that bit error groups are invariably, generated, given a corrupted parity bit.

To implement the logic for the case where a corrupted parity bit is found in the P2 position in the T1 time slot, a circuit needs to be provided that generates a 1, 1 and 0 in the T1, T2 and T3 time slots respectively. Likewise, if a corrupted parity bit appears in a P1 position, then a circuit is required which generates one3 s in three succeeding time periods (e.g. T2–T4). By then applying all of the resultant error bits, in parallel, to an Exclusive OR operation, a timed output is achieved which is indicative of the consolidated pattern of error bits occurring in the incoming parity stream.

To reiterate, the output stream from the Exclusive-OR function is all zero's if there are no corrupted bits in the parity stream. For C1=011, a single bit error in the P2 parity position produces a bit error group equal to 110. For C2=111, a single bit error in the P1 parity position produces a 111 bit error group. Overlapping bits in the bit error groups are then Exclusive OR'd (in their respective time frames) and, provide address bits (such address bits hereafter referred to as a correction vector) to an error correction table. It is again to be emphasized that the precise make up of each bit error group is dependent upon the code words employed in the encoding process.

In order to derive a Y length correction vector; $2(L-1) +2$ Y parity bits must appear in the decoding shift register (where L = the constraint length and Y = the number of bits in the correction vector). Thus, where L=3, 10 bits are required to achieve a three-bit correction vector. Prior to considering the details of how the correction vector and a correction table are employed, reference is made to FIG. 11, wherein a block diagram is shown of a circuit which performs the logical decoding functions described above. It is to be noted that the aforestated conversion of parity pairs to data bit groups is obviated since the circuit goes directly from the parity pairs to produce the correction vectors.

The parity input stream arrives via conductor 50 and is applied to a 2L length shift register 52. Shift register 52 is of the type wherein bit transfers occur on a two-by-two basis. Thus, input parity pairs P1, P2 are shifted in tandem, on a clocked basis, as are all other parity pairs. For the example given, i.e. where L=3, the length of shift register 52 is six bits and includes stages 54, 56, 58, 60, 62, 64.

The implementation of the columnar Exclusive-OR operation illustrated in FIG. 10 is achieved by providing connections to Exclusive OR circuit 66 in the reverse order of the C1 and C2 codes (See FIGS. 8 and 9). Thus, to implement the Exclusive OR columnar bit error group 110 for the P2 parity positions, conductors 68 and 70 connect shift stages 58 and 62 to Exclusive OR circuit 66. The P1 position parity state columnar code (111) is implemented by conductors 72, 74 and 76, respectively connected between shift register stages 56, 60, and 64 and Exclusive OR circuit 66.

As parity bits enter and are temporarily resident in shift register 52, Exclusive OR circuit 66 provides a single bit output indicative of the states of input lines 68, 70, 72, 74 and 76. As each subsequent pair of parity bits is clocked into shift register 52, an output bit is produced which is representative of the Exclusive OR state of all input lines to Exclusive OR 66. An L long series of output bits (correction vector) is thus accumulated in address register 80, those bits being employed as an address to correction table 82.

Correction table 82 employs each correction vector to access a pair of parity correction bits which are fed to correction register 84 which performs an Exclusive OR operation with two parity bits received from shift register 52. As the example herein presumes a three bit correction vector (which requires 10 parity bits (a "parity vector") for its generation), it is obvious that only eight unique addresses are available as correction vectors. This is many times less than the possible number of errors which could occur in the incoming parity stream (e.g. with a parity vector of 10 bits, there are 1024 possible error states, not all of which are unique). For a practical error correction system, it is preferred to have a correction vector at least 20 bits long. This would use, for example, a constraint length of 12, a twenty four bit parity shift register and requires an analysis of 62 parity bits to achieve a desired correction vector.

In all cases, correction vectors will not be able to correct all parity errors. Therefore the correction table is constructed so that unique correction vectors are employed to address only the most probable error states. For instance, single bit errors are generally most probable, double bit errors somewhat less probable, etc., etc. Given a relatively long correction vector (e.g. 20 bits), all single, double and triple bit errors and most four and five bit errors can be corrected.

Subsequent to correction, the corrected parity bits are transferred to parity-to-data table 86 wherein the groups of parity bits are converted to their proper data group in accordance with a decoding table such as that disclosed in FIG. 6, in combination with appropriate Exclusive-OR operations. (It should be noted that in the circuit of FIG. 11, the clocking is not shown to simplify the circuit diagram).

To reiterate, it can now be realized that as each pair of parity bits is newly received by shift register 52, the output of Exclusive OR circuit 66 will change if there is a parity error. If there are no erroneous parity bits, the output of Exclusive OR 66 continuously provides zero outputs. As a pair of input parity bits is shifted to the second and third stages of shift register 52, any erroneous bits therein continue to affect the output of shift register 66 and thus, the input to address register 80. Thus, any erroneous input parity bit will affect the input to address register 80, L times. Additionally, the other two pairs of parity bits in shift register 52 likewise affect the state of address register 80, L times. By analysis of all possible states which might appear in address register 80, the designer is able to empirically determine the proper correction states to be stored in correction table 82.

Figure 12:
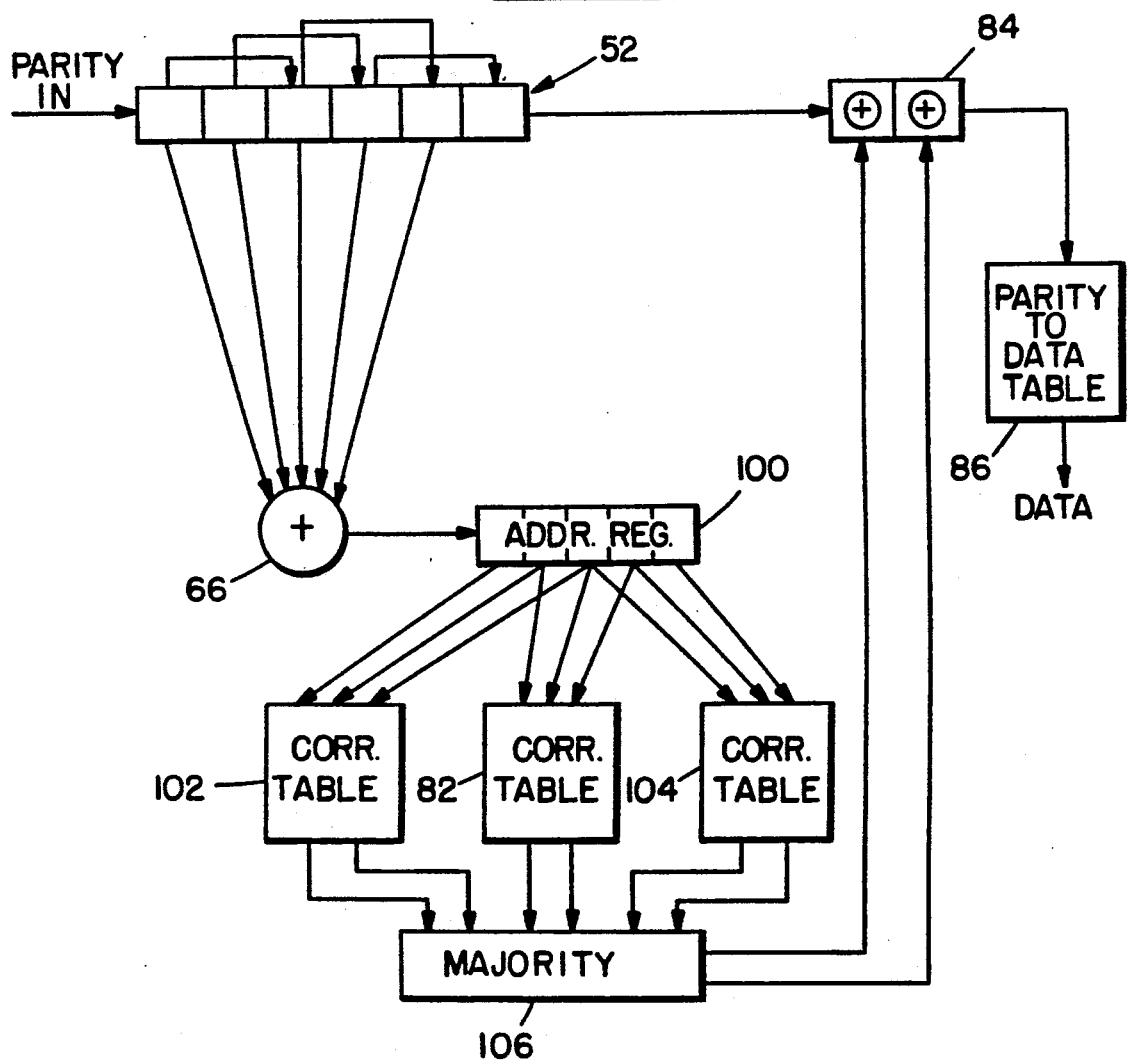
FIG. 12 is a block diagram of a decoder circuit in accordance with the invention which provides for increased certainty regarding parity correction.

Turning now to FIG. 12, a modification of the circuit of FIG. 11 is shown which provides a plurality of correction tables that enable more accurate correction bits to be provided. As above stated, error states are influenced by not only the particular bits appearing in shift register 52 but also by bits which have already been shifted out of shift register 52 as well as those that are about to shifted. In FIG. 10 it can be seen that the error states indicated for times T2, T3 and T4 are affected also by parity pairs appearing in times T1 and T5. These additional error states may be taken into account in the generation of the parity bit correction signals, by increasing the length of the address register from L bits to $2(L-1)$ bits. This is shown in FIG. 12 by address register 100. Table 82 still employs the middle 3 bits of shift register 100 as its input address; however, the first three bit positions of shift register 100 are now employed to address table 102, while its last three bits are employed to address table 104. Thus, there are now three opportunities to provide parity bit correction signals based upon additional Exclusive OR outputs which have embedded therein, additional information regarding the error states. Tables 102 and 104 operate identically as table 82, but are addressed by different input states from shift register 100. The outputs from table 82, 102 and 104 are applied to majority circuit 106 which provide an output indicative of the majority of its inputs from the respective correction tables.

The method and circuits above described will correct many parity errors. There will be error states, however, which will not be correctable as there will be insufficient information to enable proper correction signals to be generated. Nevertheless the operations of the circuits of FIGS. 11 and 12 can be made more accurate by, after the first cycle of correction, recycling the parity stream back through the error system to pick up error bits which were previously uncorrected or were wrongly introduced. In addition, by increasing the length of the code words, additional error correction capability can be achieved but with concomitant increases in sizes of the address registers and correction tables.

It should understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A system for decoding a convolutionally encoded parity bit stream, said bit stream having a greater number of parity bits than data bits from which said parity bits were derived, said bit stream convolutionally encoded by use of at least a pair of code words, each code word having a bit length =L, said code words providing said bit stream with sets of parity bits which uniquely correspond to sets of data bits of bit length =D, the system comprising:
   means for receiving said encoded parity bit stream and for deriving Exclusive OR results from a succession of lengths of said parity bits, a non-zero Exclusive-OR result indicating at least an erroneous parity bit;
   correction table means responsive to a set of Exclusive-OR results to provide parity bit correction signals; and
   means for altering said encoded parity bit stream in accordance with said parity bit correction signals.

2. The invention as recited in claim 1 further comprising: data table mean responsive to said altered, encoded parity bits to generate data bit sets corresponding thereto.

3. The invention as recited in claim 1 wherein said Exclusive OR results are derived from succeeding parity bit sets, each set of bit length 2L.

4. The invention as recited in claim 3 wherein said receiving and deriving means further comprises:
   a register having a plurality of stages, for receiving said parity bits;
   logical means for providing an Exclusive OR function; and
   means for interconnecting certain of stages to said logical means in a manner governed by bit arrangements of said code words.

5. The invention as recited in claim 4 wherein said register has a plurality of first stages for parity bits created by a first code word and a plurality of second stages for parity bits created by a second code word, said interconnecting means connecting certain of said first stages to said logic means in accordance with bits of one kind of said second code word and connecting said second stages to said logic means in accordance with bits of one kind of said first code word, said interconnections indicating to said logic means the one or zero states stored in the respective stages.

6. The invention as recited in claim 4, wherein said register has L first stages and L second stages.

7. The invention as recited in claim 6 wherein only those L first stages are connected to said logic means which positionally correspond to one bits in the second code word, arranged in reverse order, and only those L second stages are connected to said logic means which positionally correspond to one bits in the first code word, arranged in reverse order.

8. The invention as recited in claim 7 wherein said register is a serial shift register, with said L first stages interleaved with said L second stages.

9. The invention as defined in claim 8 wherein the Exclusive OR results from said logic means are manifest by a series of bits of length L, said series of bits employed to address said correction table means.

10. A method for decoding a convolutionally encoded parity bit stream, having a greater number of parity bits than data bits from which said parity bits were derived, said convolutional encoding employing code words, each of bit length L, said code words resulting in the generation of a series of parity bits, a $2(L-1)$ length of said parity bits bearing a unique relationship to a data bit set of length $2(L-1)$, said decoding method comprising:
   producing Exclusive-OR bit groups from a succession of 2L lengths of parity bits;
   employing non-zero Exclusive-OR bit groups to determine probable parity bit corrections; and
   correcting said encoded parity bit stream in accordance with said probable parity bit corrections.

11. The method of claim 10 wherein said encoded bit stream includes, parity sets, each set including one parity bit for each code word, said producing step further comprising
   feeding said parity sets into 2L shift register stages;
   sensing the data state of certain of said 2L shift register stages, said certain stages positionally related to bit states of one kind in said code words
   Exclusive Or'ing said sensed data states to provide Exclusive OR bit groups.

12. The method of claim 11 further comprising the steps of:
   providing a table of probable parity bit correction indications;
   said employing step including the use of said Exclusive OR bit groups to address said table to access a corresponding parity bit correction indication.

13. The method of claim 12 further comprising the step of:
   correcting said encoded bit stream through the use of said probable parity bit correction indications.

14. The method of claim 13 further comprising the steps of:
   providing a second table for converting said corrected parity bit stream to data bit sets, said second table relating a length of parity bits having a single 1 indication to a corresponding data bit set, and including a plurality of said parity bit lengths, each with a 1 in a different bit position;
   selecting those data bit sets which correspond to parity bit lengths having 1's in bit positions equivalent to 1's in said corrected parity bit stream; and
   Exclusive OR'ing said selected data bit sets to obtain a composite data bit set.

* * * * *